United States Patent
Pavinski, Jr. et al.

(10) Patent No.: US 8,373,996 B2
(45) Date of Patent: Feb. 12, 2013

(54) DUAL-LEVEL PACKAGE

(75) Inventors: Donald J. Pavinski, Jr., West Pittston, PA (US); August Spannagel, San Francisco, CA (US); Charles H. Joyner, Sunnyvale, CA (US); Peter W. Evans, Mountain House, CA (US); Matthew Fisher, Mountain View, CA (US); Mark J. Missey, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 479 days.

(21) Appl. No.: 12/499,067

(22) Filed: Jul. 7, 2009

(65) Prior Publication Data

US 2011/0007486 A1 Jan. 13, 2011

(51) Int. Cl.
*H05K 7/00* (2006.01)
(52) U.S. Cl. .......... 361/760; 361/777; 361/776
(58) Field of Classification Search .......... 361/760, 361/776, 777, 715, 709, 780
See application file for complete search history.

(56) References Cited

U.S. PATENT DOCUMENTS

| 5,909,524 | A  | * | 6/1999  | Tabuchi       | 385/49  |
| 6,646,887 | B2 | * | 11/2003 | Yang et al.   | 361/759 |
| 7,783,142 | B2 | * | 8/2010  | Riska         | 385/14  |
| 2011/0044593 | A1 | * | 2/2011 | Kihara et al. | 385/93  |
| 2012/0163749 | A1 | * | 6/2012 | Huang et al.  | 385/3   |

* cited by examiner

*Primary Examiner* — Yuriy Semenenko
(74) *Attorney, Agent, or Firm* — David L. Soltz

(57) ABSTRACT

Consistent with an aspect of the present disclosure, a package is provided that has a carrier and first and second substrates provided on the carrier. Conductive traces are provided on the first substrate (upper traces) and below it (lower traces) to provide two levels of electrical connectivity to a photonic integrated circuit (PIC) provided on the second substrate. As a result, an increased number of connections can be made to the PIC in a relatively small package, while maintaining adequate spacing and line widths for each trace. In addition, the lower traces are connected to bonding pads on the surface of the first substrate and are thus provided in the same plane as the upper traces. Testing of and access to both upper and lower traces is thus simplified.

20 Claims, 4 Drawing Sheets

DUAL-LEVEL PACKAGE

BACKGROUND

Wavelength division multiplexed (WDM) optical communication systems are known in which multiple optical signals, each having a different wavelength, are combined onto a single optical fiber. Such systems typically include a laser associated with each wavelength, a modulator configured to modulate the output of the laser, and an optical combiner to combine each of the modulated outputs. Conventional WDM systems have been constructed from discrete components. For example, the lasers, modulators and combiners have been packaged separately and mounted on a printed circuit boards. More recently, however, many WDM components including transmitters, receivers and passive devices have been integrated onto a single chip also referred to as a photonic integrated circuit (PIC).

Optical signals output from a PIC are typically modulated to carry data. For example, in the common RZ modulation format, an optical pulse having an optical power that exceeds a threshold value for a particular duration represents, for example, a logical 1 bit. On the other hand, a pulse having an optical power less than the threshold represents a logical 0 bit, for example.

In order to further increase data transmission rates associated with WDM systems, other modulation formats have been proposed for generating a modulated output. One such modulation format, known as polarization multiplexed differential quadrature phase-shift keying ("Pol Mux DQPSK"), can provide higher data rates as compared to the RZ modulation format. Thus, transmitter PICs that output Pol Mux DQPSK or other so-called "advanced modulation format" signals have been developed that include more components and greater complexity than PICs that supply RZ formatted signals, for example. Packaging of advanced modulation format PICs is also rendered more complicated, since the package should preferably have a reduced size, but accommodate an increased number of connections or pins. Advantageously, the package housing an advanced modulation format PIC, for example, should also facilitate simplified testing of the PIC.

SUMMARY

Consistent with an aspect of the present disclosure, a device is provided that comprises a carrier having a surface and a plurality of first conductors provided on the surface of the carrier. The device also includes a first substrate overlies a first portion of the surface of the carrier, and a portion of each of the plurality of first conductors is provided between the first substrate and the first portion the on the surface of the carrier. A plurality of second conductors is provided on a surface of the first substrate. A plurality of third conductors is provided on the surface of the first substrate, and a second substrate overlies a second portion of the surface of the carrier. A plurality of circuit components are provided on the second substrate. In addition, a first wire electrically connects a first one of the plurality of circuit components with one of the plurality of first conductors, and a second wire electrically connects said one of the plurality of first conductors with one of the plurality of second conductors, such that said one of the plurality of second conductors is electrically connected to the first one of the plurality of circuit components. Further, a third wire electrically connects a second one of the plurality of circuit components with one of the plurality of third conductors.

Consistent with an additional aspect of the present disclosure, a device is provided that comprises a carrier having a surface, and a plurality of first conductive traces provided on the surface of the carrier. A first substrate is also provided that overlies a first portion of the surface of the carrier. A portion of each of the plurality of the plurality of conductive traces is provided between the first substrate and the first portion the on the surface of the carrier. In addition, a plurality of bonding pads is provided on a surface of the first substrate. A plurality of second conductive traces is provided on the surface of the first substrate, and a second substrate overlies a second portion of the surface of the carrier. Further, a plurality of circuit components is provided on the second substrate. A first wire electrically connects a first one of the plurality of circuit components with a first end of one of the plurality of first conductive traces, and a second wire electrically connects a second end of one of the plurality of conductive traces with one of the plurality of bonding pads, such that said one of the plurality of bonding pads is electrically connected to the first one of the plurality of circuit components. Moreover, a third wire is provided that electrically connects a second one of the plurality of circuit components with one of the plurality of second conductive traces.

It is to be understood that both the foregoing general description and the following detailed description are exemplary and explanatory only and are not restrictive of the invention, as claimed.

The accompanying drawings, which are incorporated in and constitute a part of this specification, embodiments of the disclosure and together with the description, serve to explain the principles of the invention.

DESCRIPTION OF THE EMBODIMENTS

Consistent with an aspect of the present disclosure, a package is provided that has a carrier and first and second substrates provided on the carrier. Conductive traces are provided on the first substrate (upper traces) and below it (lower traces) to provide two levels of electrical connectivity to a photonic integrated circuit (PIC) provided on the second substrate. As a result, an increased number of connections can be made to the PIC in a relatively small package, while maintaining adequate spacing and line widths for each trace. In addition, the lower traces are connected to bonding pads on the surface of the first substrate and are thus provided in the same plane as the upper traces. Testing of and access to both upper and lower traces is thus simplified.

Reference will now be made in detail to the present exemplary embodiments of the disclosure, examples of which are illustrated in the accompanying drawings. Wherever possible, the same reference numbers will be used throughout the drawings to refer to the same or like parts.

Figure 1:
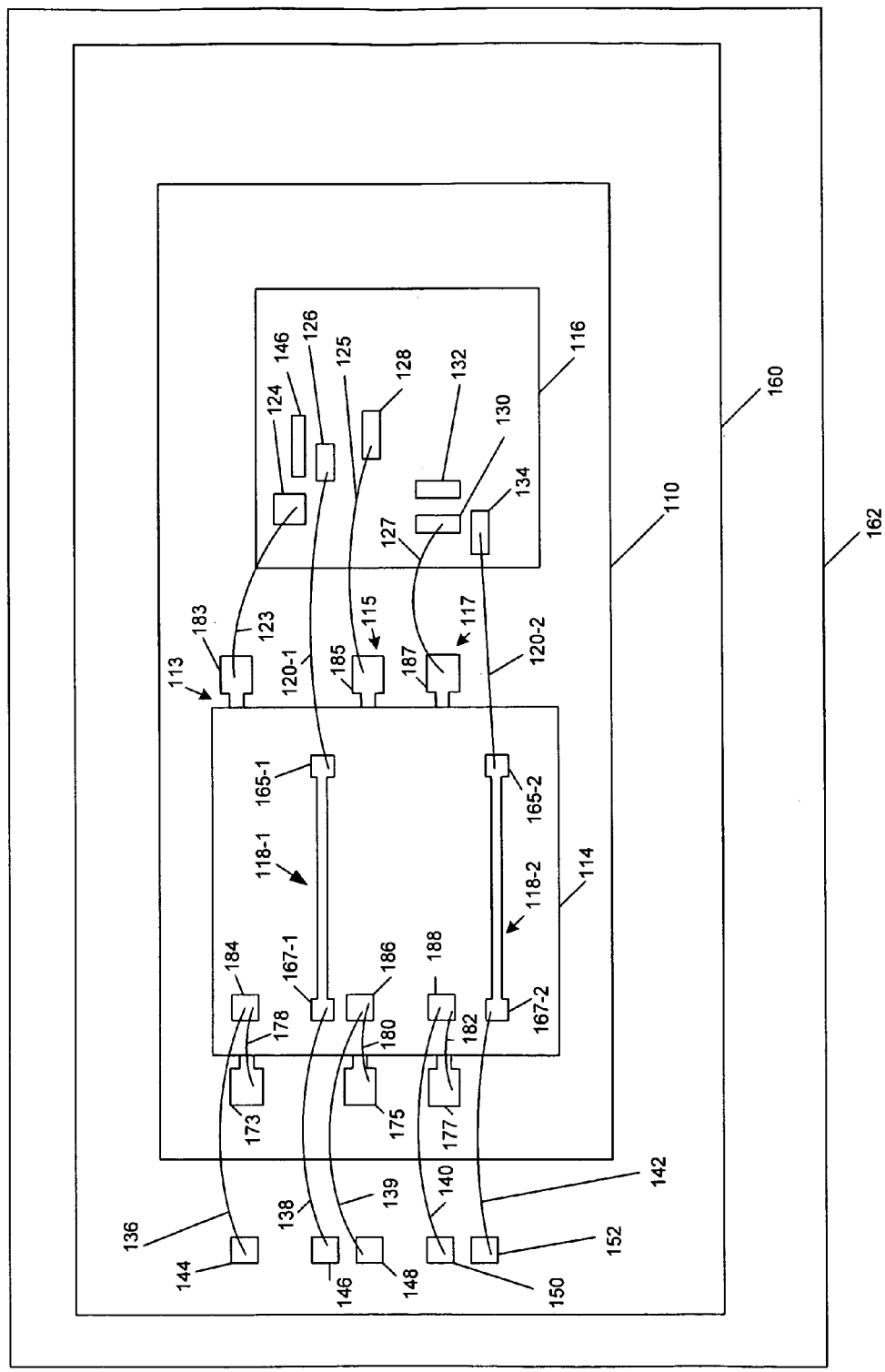
FIG. 1 is a plan view of a package consistent with a present aspect of the present disclosure.

FIG. 1 illustrates a plan view of package 100 consistent with an aspect of the present disclosure. Package 100 includes a carrier 110, which may include a known ceramic material, for example. A plurality of conductors ("first conductors") or conductive traces 113, 115, and 117 may be provided on a surface of carrier 110. First substrate 114 and second substrate 116 may be provided on carrier 110. A plurality of conductors ("second conductors") or bonding pads 184, 186, and 188 are provided on substrate 114, as well as a plurality of conductors ("third conductors") or conductive traces 118-1 and 118-2.

Carrier 110 may be provided on a frame 160, which has a plurality of bonding pads 144, 146, 148, 150, and 152 that provide electrical signals to/from traces or bonding pads on substrate 114 through wires 136, 138, 139, 140, and 142, respectively. Frame 160 may constitute a land grid array (LGA) package and may be provided on interposer 162.

As further shown in FIG. 1, substrate 116 may include a photonic integrated circuit having a plurality of circuit components 124, 126, 128, 132, 130, 134, and 146. For example, component 132 may be a laser and component 130 may be a modulator. In addition, component 128 may be a heater that adjusts a wavelength of light output from component 132 in a known manner. In addition, component 124 may be a photodiode that supplies a signal indicative of a power level of light output form component 146, which may also constitute a laser. Substrate 116 may include indium phosphide (InP), for example.

As noted above, the number of components provided included in PICs has increased with increasing optical signal data rates. In order to provide connections to such PICs within a relatively small package, two layers of electrical connectivity may be provided within the package. For example, as shown in FIG. 1, portions of wires 123, 125, and 127 are attached to corresponding bonding pads 183, 185, and 187 in order to provide connections to components 124, 128, and 130, respectively. Bonding pads 183, 185, and 187 constitute portions of traces 113, 115, and 117, respectively, and provide a first layer of electrical connectivity that extends beneath substrate 114. A second layer of electrical connectivity may include traces 118-1 and 118-2, which are provided on substrate 114 and include bonding pads 165-1 and 165-2, respectively. In particular, as shown in FIG. 1, portions of wires 120-1 and 120-2 are attached to bonding pads 165-1 and 165-2 to provide an electrical connection to components 126 and 134. In one example, traces 118-1 and 118-2 may provide relatively high frequency or radio frequency (RF) signals to components 126 and 134, which may be modulators, for example. On the other hand, slowly varying or direct current (DC) signals, voltages or biases may be supplied from traces 113, 115, and 117. Such biases may include a ground potential or a reference potential. By providing multiple layers of electrical connectivity to the PIC components, the number of traces and wiring that provide such connectivity may be increased, but still accommodated within a relatively small package. Moreover, the spacings and linewidths of the traces may be relatively wide in order to insure adequate electrical isolation and reduced cross-talk.

Each of traces 113, 115, and 117 include bonding pads 173, 175, and 177, typically provided at an end of each trace opposite that of bonding pads 183, 185, and 187. Optionally, wires 178, 180, and 182 may connect bonding pads 173, 175, and 177 to bonding pads 184, 186, and 188, respectively. Further connections to external bonding pads of frame 160 are provided by additional wires. Namely, wire 136 connects pad 184 with external pad 144; wire 139 connects pads 186 with pad 148; and wire 140 connects pad 188 with pad 150.

Traces 118-1 and 118-2 include additional bonding pads 167-1 and 167-2, which are provided at ends of each trace opposite that of bonding pads 165-1 and 165-2, respectively. Wire 138 provides an electrical connection between external pad 148 and pad 167-1, and wire 140 provides a connection between pads 188 and 152. As noted above, external pads 148 and 152 are also provided on frame 160.

Preferably, bonding pads 184, 186, and 188 are provided on substrate 114 along with traces 118-1 and 118-2, such that wire bond connections may be made to traces 118-1 and 118-2 and bonding pads 184, 186, and 188 on the same planar surface of substrate 114. Accordingly, additional adjustments to equipment that provide such wire bond connections are not necessary when wire bonding to pad 184 and trace 118-1, for example. Test probes (not shown) may also be more readily connected to traces 118-1 and 118-2, as well as bonding pads 184, 186, and 188.

Figure 2:
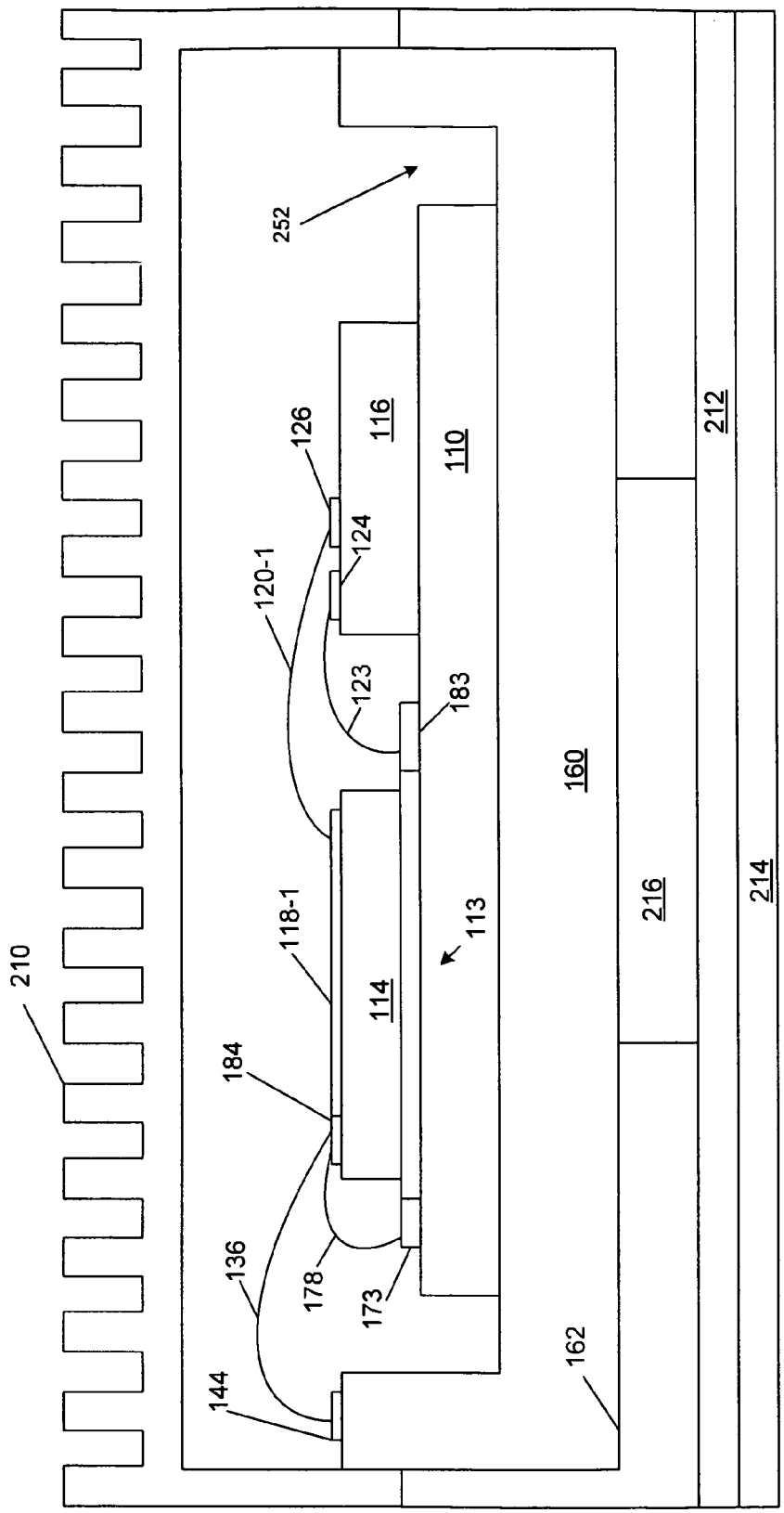
FIG. 2 is a side view of the package shown in FIG. 1.

FIG. 2 illustrates a side view of package 100 including features not shown in FIG. 1. Namely, package 100 may include a heat sink 210 that is thermally coupled to substrate 116. In addition, interposer 162 may include an opening 216 over which a recessed portion 252 of frame 160 may be provided. Interposer 162 may be provided on a printed circuit board 212, which, in turn, may be provided on plate 214.

Figure 3:
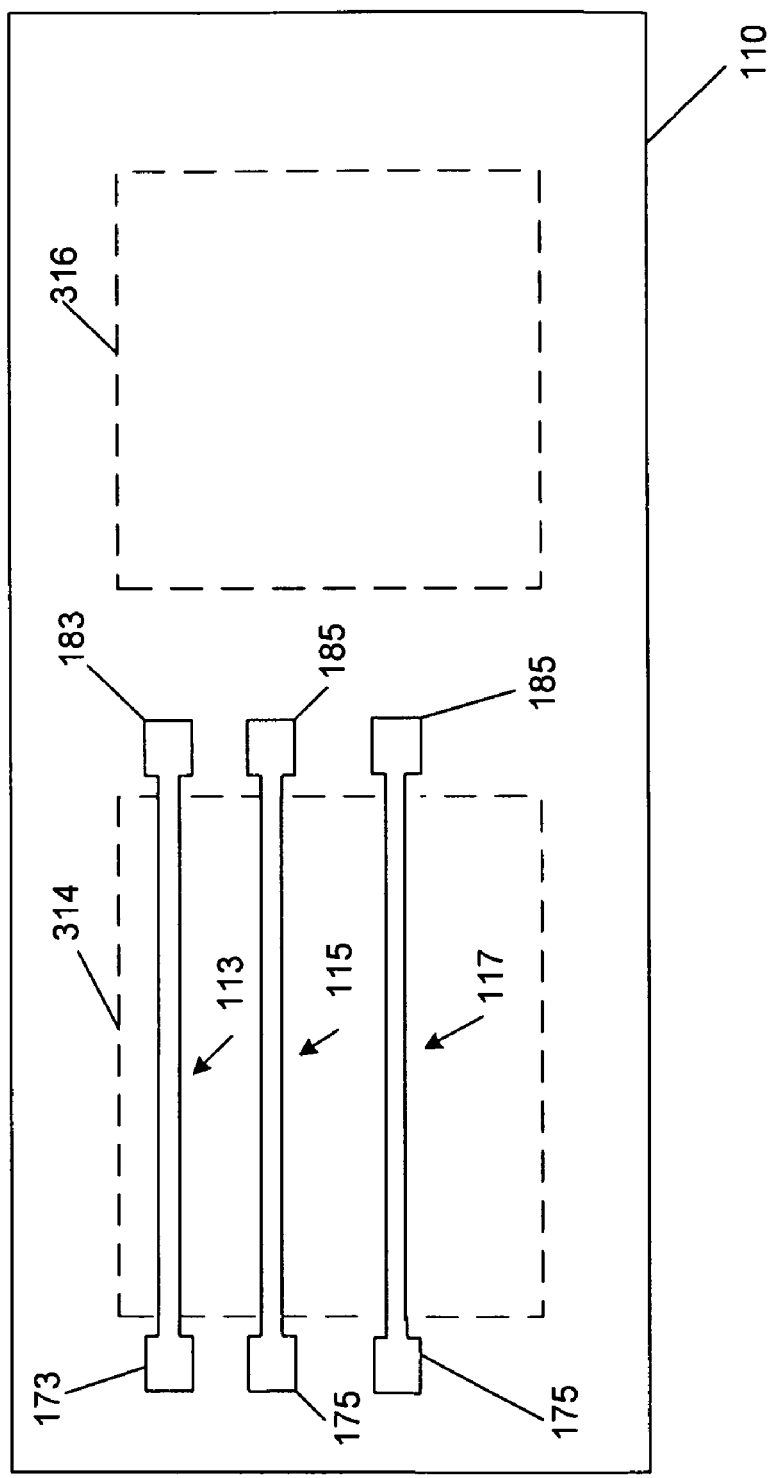
FIG. 3 is a plan view of a carrier consistent with an additional aspect of the present disclosure.

FIG. 3 illustrates carrier 110 without substrates 114 and 116. Preferably, portions or sections of traces 113, 115, and 117 are provided between portion 314 of the surface of carrier 110 and substrate 114. Substrate 116 is preferably provided over portion 316 of the surface of carrier 110.

Figure 4:
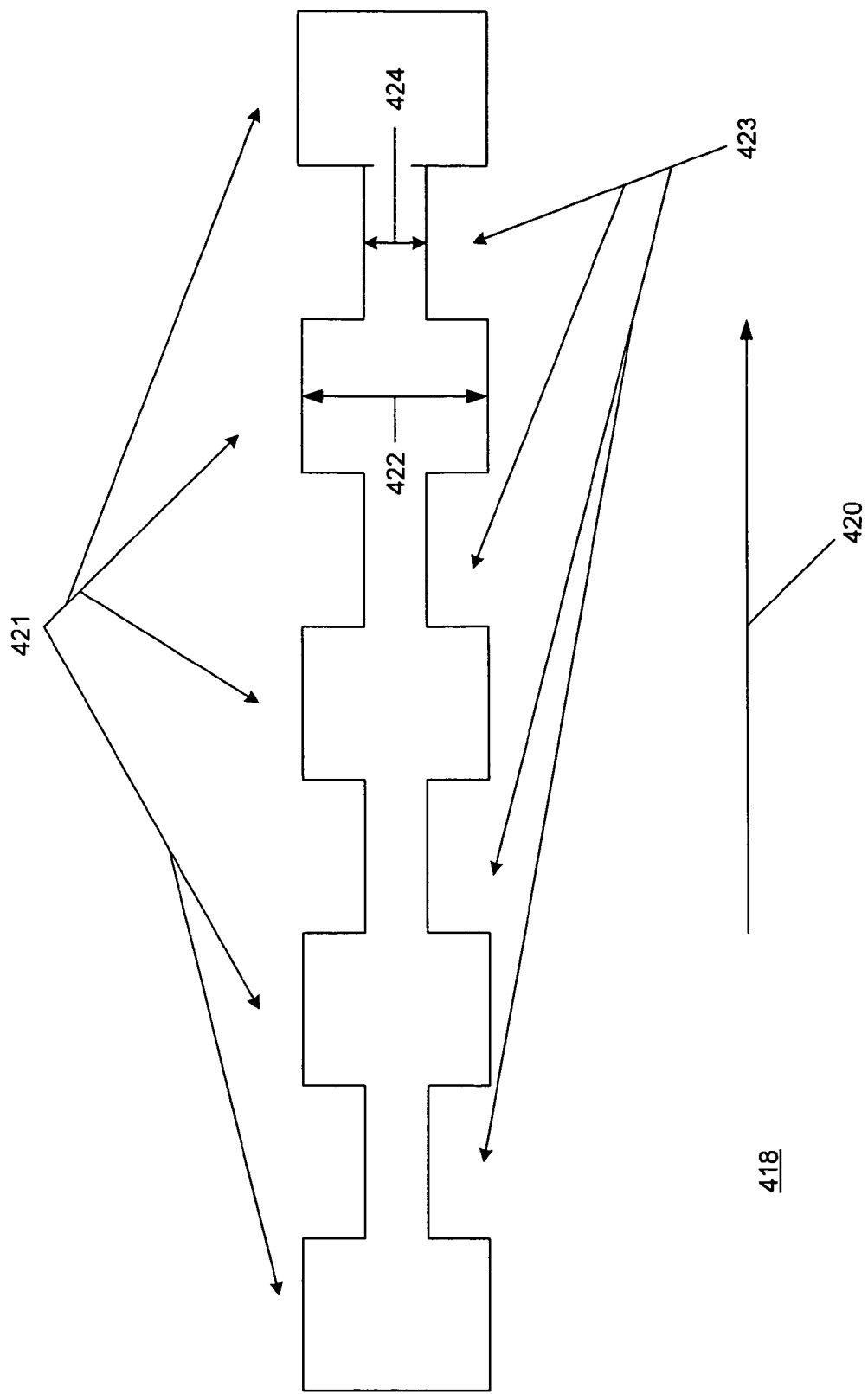
FIG. 4 is a plan view of a conductive trace in accordance with a further aspect of the present disclosure.

FIG. 4 illustrates conductive trace 418, which may replace conductive traces 118-1 and 118-2. Conductive trace 418 may extend in a first direction indicated by arrow 420 and may include first portions 421 and second portions 423. Each of first portions 421 may have a width (arrow 422) extending in a second direction transverse to the first direction. In addition, each of second portions 423 may include a width (arrow 424) that extends in the second direction. The width of portions 421 is preferably greater than that of portions 423 in order to provide a plurality of bonding locations for wires connecting to components on substrate 116 or to pads provided on frame 160. Accordingly, wires of varying lengths may be used to connect traces, such as trace 418, to PIC components provided on substrate 116, thereby rendering such wire bonding more convenient.

Other embodiments will be apparent to those skilled in the art from consideration of the specification and practice of the subject matter disclosed herein. It is intended that the specification and examples be considered as exemplary only, with a true scope and spirit of the invention being indicated by the following claims.

What is claimed is:

1. A device comprising:
    a carrier having a surface;
    a plurality of first conductors provided on the surface of the carrier;
    a first substrate overlying a first portion of the surface of the carrier, a portion of each of the plurality of first conductors being provided between the first substrate and the first portion the on the surface of the carrier;
    a plurality of second conductors provided on a surface of the first substrate;
    a plurality of third conductors provided on the surface of the first substrate;
    a second substrate overlying a second portion of the surface of the carrier;
    a plurality of circuit components provided on the second substrate;
    a first wire electrically connecting a first one of the plurality of circuit components with one of the plurality of first conductors;
    a second wire electrically connecting said one of the plurality of first conductors with one of the plurality of second conductors, such that said one of the plurality of second conductors is electrically connected to the first one of the plurality of circuit components; and a third wire electrically connecting a second one of the plurality of circuit components with one of the plurality of third conductors.

2. A device in accordance with claim 1, wherein said one of the plurality of first conductors includes a first bonding pad and a second bonding pad, a portion of the first wire is attached to the first bonding pad and a portion of the second wire is attached to the second bonding pad.

3. A device in accordance with claim 2, wherein said one of the plurality of second conductors constitutes a third bonding pad, the portion of the second wire is a first portion of the second wire, a second portion of the second wire is attached to the third bonding pad.

4. A device in accordance with claim 1, wherein said one of the plurality of third conductors extends in a first direction and includes first portions and second portions, each of the first portions of said one of the plurality of third conductors having a first width that extends in second direction transverse to the first direction, each of the second portions said one of the plurality of third conductors having a second width that extends in the second direction, the first width being greater than the second width.

5. A device in accordance with claim 4, wherein the second wire is attached to one of the second portions of said one of the plurality of third conductors.

6. A device in accordance with claim 1, wherein said one of the plurality of second conductors supplies a first signal to the first one of the plurality of components, and said one of the third plurality of conductors supplies a second signal to the second one of the plurality of components.

7. A device in accordance with claim 1, wherein the first one of the plurality of components includes a laser and the second one of the plurality of components includes a modulator.

8. A device in accordance with 7, wherein said one of the plurality of second conductors is configured to supply a first voltage to the laser and said one of the plurality of third conductors is configured to supply a second voltage to the modulator.

9. A device in accordance with claim 1, wherein the first one of the plurality of components includes a heater, a third one of the plurality of components includes a laser, and said one of the plurality of second conductors is configured to supply a control signal to the heater, to thereby adjust a wavelength of light output from the laser.

10. A device in accordance with claim 1, wherein the first one of the plurality of components includes a photodiode, a third one of the plurality of components includes a laser, and said one of the plurality of second conductors supplies a signal indicative of a power level of light output from the laser.

11. A device in accordance with claim 1, wherein said one of the plurality of second conductors supplies a ground potential to the first one of the plurality of components.

12. A device in accordance with claim 1, further including an interposer, the interposer having a recessed portion, the carrier being provided in the recessed portion.

13. A device in accordance with claim 1, further including a heat sink that is configured to be thermally coupled to the second substrate.

14. A device in accordance with claim 12, further including a plate, the interposer being provided on the plate.

15. A device in accordance with claim 1, wherein the device includes a package, the package being a land grid array (LGA) package.

16. A device comprising:
a carrier having a surface;
a plurality of first conductive traces provided on the surface of the carrier;
a first substrate overlying a first portion of the surface of the carrier, a portion of each of the plurality of conductive traces being provided between the first substrate and the first portion the on the surface of the carrier;
a plurality of bonding pads provided on a surface of the first substrate;
a plurality of second conductive traces provided on the surface of the first substrate;
a second substrate overlying a second portion of the surface of the carrier;
a plurality of circuit components provided on the second substrate;
a first wire electrically connecting a first one of the plurality of circuit components with a first end of one of the plurality of first conductive traces;
a second wire electrically connecting a second end of one of the plurality of conductive traces with one of the plurality of bonding pads, such that said one of the plurality of bonding pads is electrically connected to the first one of the plurality of circuit components; and
a third wire electrically connecting a second one of the plurality of circuit components with one of the plurality of second conductive traces.

17. A device in accordance with claim 16, wherein said one of the plurality of second conductive traces extends in a first direction and includes first and second portions, each of the first portions of said one of the plurality of second conductive traces having a first width that extends in a second direction transverse to the first direction, and each of the second portions of said one of the plurality of conductive traces having a second width that extends in the second direction, the first width being greater than the second width.

18. A device in accordance with claim 17, wherein the third wire is attached to one of the second portions of said one of the plurality of second conductive traces.

19. A device in accordance with claim 16, wherein said one of the plurality of bonding pads provides a first signal and said one of the plurality of second conductive traces supplies a second signal.

20. A device in accordance with claim 19, wherein the second one of the plurality of circuit components includes an optical modulator, the first signal is a reference potential and the second signal is a signal that drives the optical modulator.

* * * * *